United States Patent
Choe

(10) Patent No.: US 8,008,148 B2
(45) Date of Patent: Aug. 30, 2011

(54) METHOD OF MANUFACTURING M-I-M CAPACITOR OF SEMICONDUCTOR DEVICE

(75) Inventor: Ho-Yeong Choe, Jung-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 309 days.

(21) Appl. No.: 12/436,890

(22) Filed: May 7, 2009

(65) Prior Publication Data

US 2009/0283857 A1 Nov. 19, 2009

(30) Foreign Application Priority Data

May 15, 2008 (KR) .................. 10-2008-0045046

(51) Int. Cl.
*H01L 21/8242* (2006.01)
(52) U.S. Cl. ........ 438/250; 438/393; 438/760; 438/957; 257/E21.409
(58) Field of Classification Search .................. 438/250, 438/393, 760, 957; 257/E21.409
See application file for complete search history.

(56) References Cited

U.S. PATENT DOCUMENTS

| 2002/0159010 A1* | 10/2002 | Maeda et al. ................. 349/113 |
| 2007/0275525 A1* | 11/2007 | Das et al. ...................... 438/250 |
| 2008/0217740 A1* | 9/2008 | Shiramizu et al. ............ 257/536 |

FOREIGN PATENT DOCUMENTS

KR 2007-65035 6/2007

* cited by examiner

*Primary Examiner* — Thanh V Pham
(74) *Attorney, Agent, or Firm* — Sherr & Vaughn, PLLC

(57) ABSTRACT

A method for manufacturing a semiconductor device includes sequentially forming an insulating layer and a metal layer over a semiconductor substrate, forming a photoresist pattern over the metal layer and etching the metal layer using the photoresist pattern as an etching mask to form a metal line pattern, subjecting the photoresist pattern to a reflow process to form a photoresist pattern over the metal layer and etching the metal layer using the photoresist pattern as an etching mask to form a metal line pattern, subjecting the photoresist pattern to a reflow process to form a reflowed photoresist pattern surrounding the metal line pattern, forming a metal-insulator-metal (MIM) layer over the semiconductor substrate provided with the reflowed photoresist pattern, and removing the MIM layer arranged over the photoresist pattern and the photoresist pattern.

13 Claims, 3 Drawing Sheets

METHOD OF MANUFACTURING M-I-M CAPACITOR OF SEMICONDUCTOR DEVICE

Figure 1:
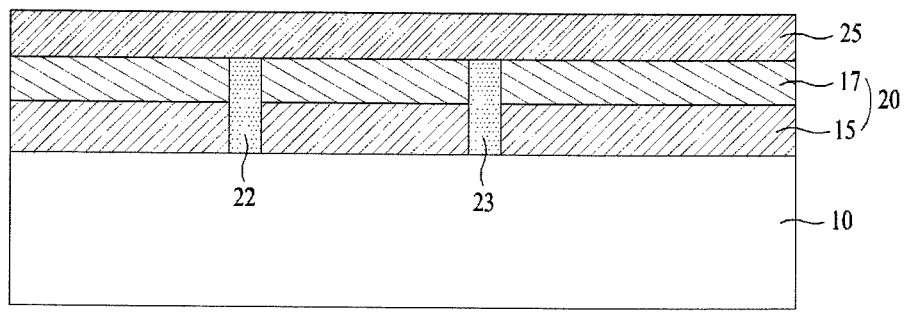

The present application claims priority under 35 U.S.C. 119 to Korean Patent Application No. 10-2008-0045046 (filed on May 15, 2008), which is hereby incorporated by reference in its entirety.

BACKGROUND

Merged memory logic (MML) is a complex semiconductor device which integrates a memory cell array and an analog or peripheral circuit in one chip. A great deal of research is underway to realize high-integration and high-speed semiconductor devices used for such a complex semiconductor device. For example, ardent research is being performed to realize a high-capacitance capacitor in analog circuits requiring high-speed operation.

In polysilicon-insulator-polysilicon (PIP) capacitors, an upper electrode and a lower electrode are made of conductive polysilicon, thus causing oxidation reactions on the interfaces between dielectric thin film and the upper and lower electrodes. The oxidation reaction causes formation of native oxide films, thus disadvantageously reducing overall capacitance. Another disadvantage is that PIP capacitors have a low capacitance due to depletion regions formed on the polysilicon layer and are thus unsuitable for high-speed and high-frequency operations.

In order to mitigate the disadvantages of PIP capacitors, metal-insulator-metal (MIM) capacitors may be used. A MIM capacitor has a structure in which a lower metal, an insulating layer and an upper metal are laminated, in that order. The MIM capacitor has a low specific resistance and is free from parasitic capacitance by depletion, thus being generally applicable in high-performance semiconductor devices.

In order to realize such a MIM capacitor in semiconductor devices, in addition to photoresist patterns to form metal line patterns, separate photoresist patterns to form the MIM capacitor are required.

SUMMARY

Embodiments relate to a semiconductor device. More specifically, embodiments relate to a method for manufacturing a metal-insulator-metal (MIM) capacity of a semiconductor device. Embodiments relate to a method for manufacturing a MIM capacitor without using an additional photoresist pattern.

Embodiments relate to a method for manufacturing a semiconductor device which includes: sequentially forming an insulating layer and a metal layer over a semiconductor substrate; forming a photoresist pattern over the metal layer and etching the metal layer using the photoresist pattern as an etching mask to form a metal line pattern; subjecting the photoresist pattern to a reflow process to form a reflowed photoresist pattern surrounding the metal line pattern; forming a metal-insulator-metal (MIM) layer over the semiconductor substrate provided with the reflowed photoresist pattern; and removing the MIM layer arranged over the photoresist pattern and the photoresist pattern.

In accordance with another aspect, provided is a semiconductor device, including: an insulating layer formed over a semiconductor substrate; metal lines formed in a first region over the insulating layer; and a metal-insulator-metal (MIM) capacitor pattern formed in a second region over the insulating layer provided between the metal lines.

The MIM capacitor pattern may be parallel to the metal lines, with respect to the semiconductor substrate. The insulating layer may be composed of at least one of a fluorine doped silicate (FSG) glass and $SiH_4$. The metal lines may be composed of aluminum, copper, or tungsten.

DRAWINGS

Example FIG. 1 is a sectional view illustrating a process for depositing a metal over a semiconductor substrate to form a metal line.

Figure 2:
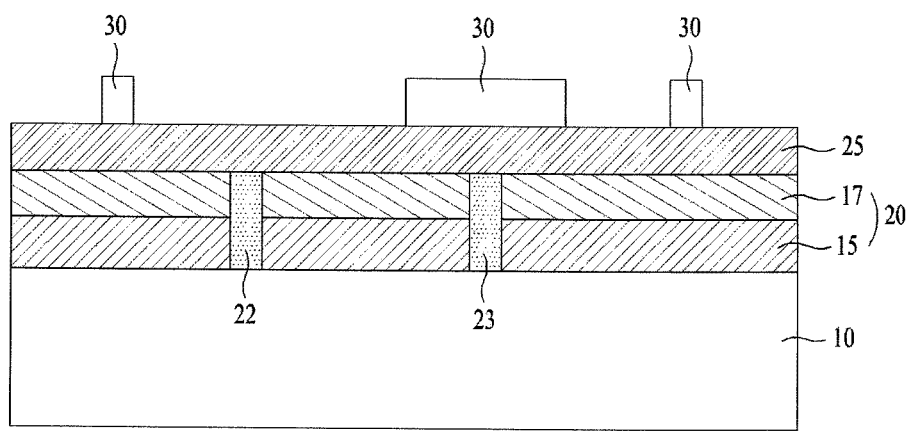

Example FIG. 2 is a sectional view illustrating a process for forming photoresist patterns to form metal line patterns.

Figure 3:
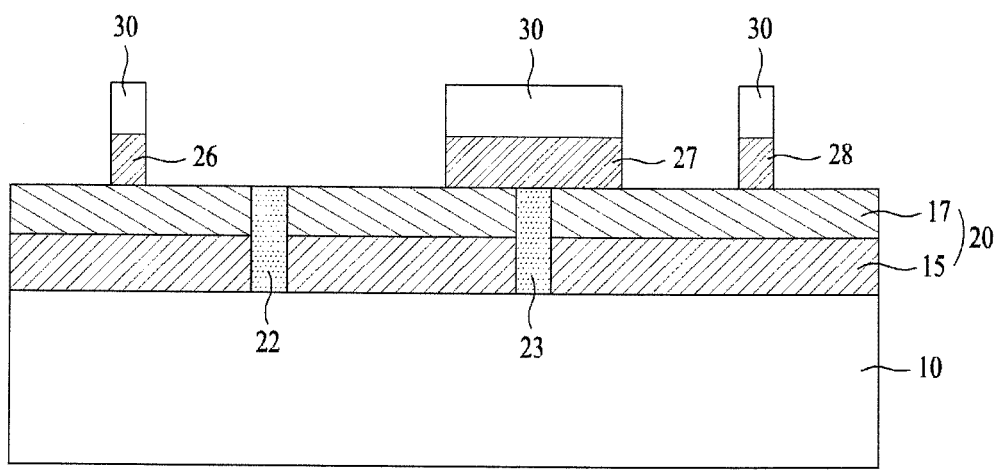

Example FIG. 3 is a sectional view illustrating a process for forming first metal line patterns using the photoresist patterns.

Figure 4:
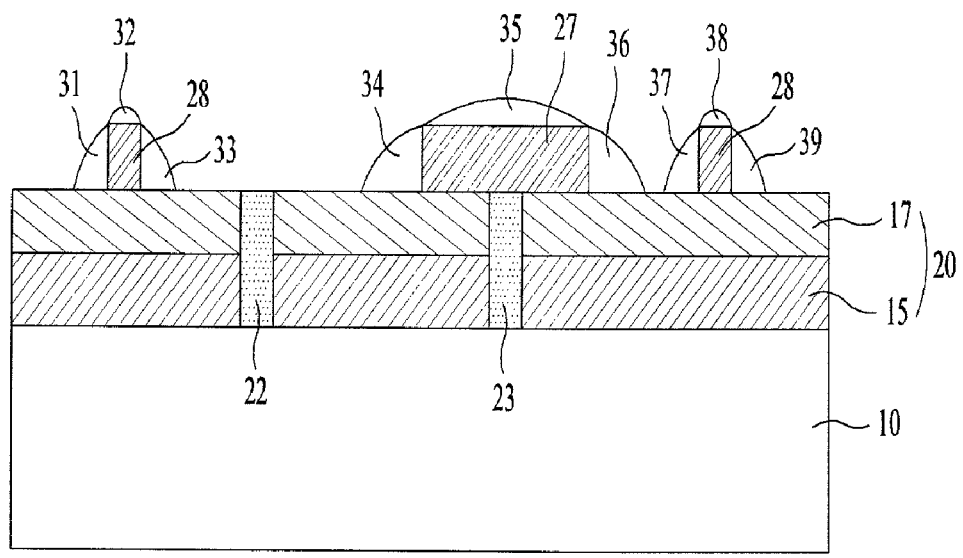

Example FIG. 4 is a sectional view illustrating a process for reflowing photoresist patterns to form a MIM capacitor pattern.

Figure 5:
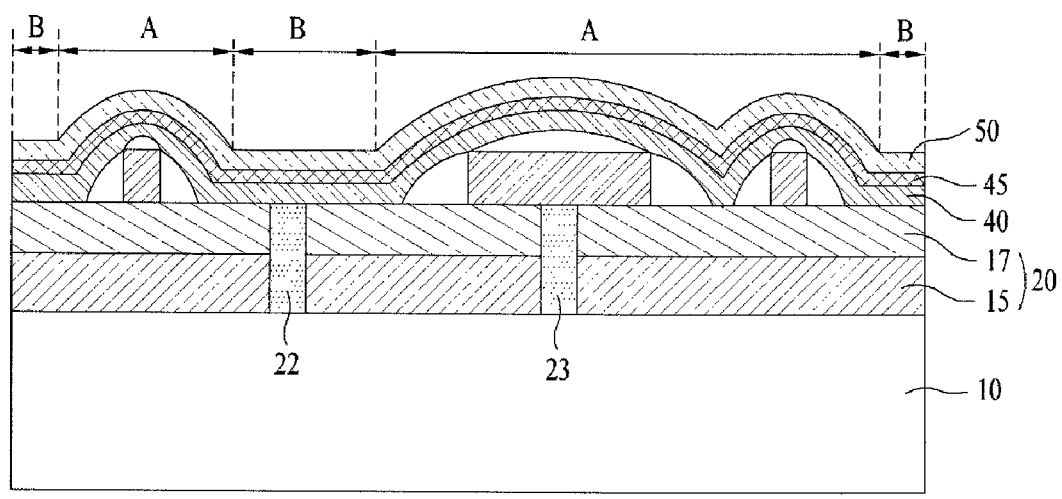

Example FIG. 5 is a sectional view illustrating a process for forming a MIM layer over a semiconductor substrate.

Figure 6:
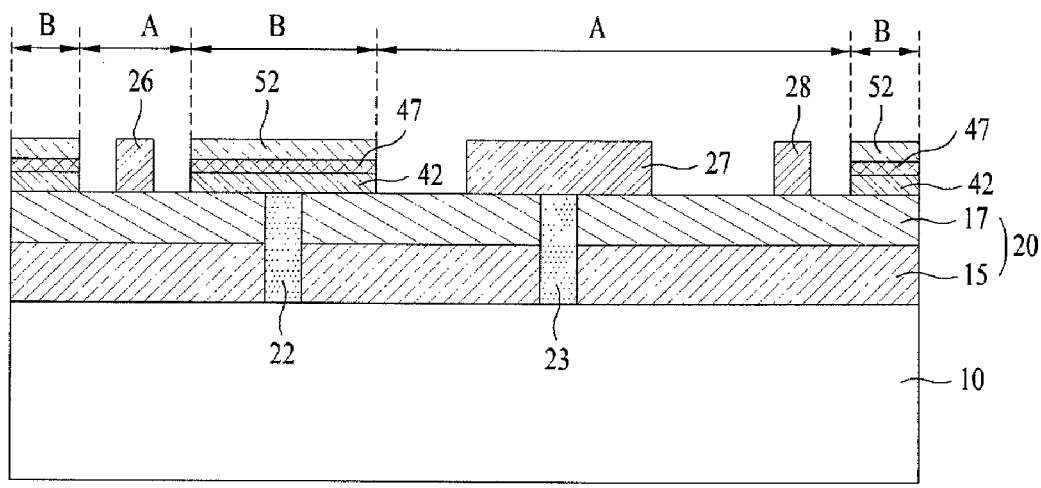

Example FIG. 6 is a sectional view illustrating a process for forming a MIM capacitor pattern using a lift-off process.

Figure 7:
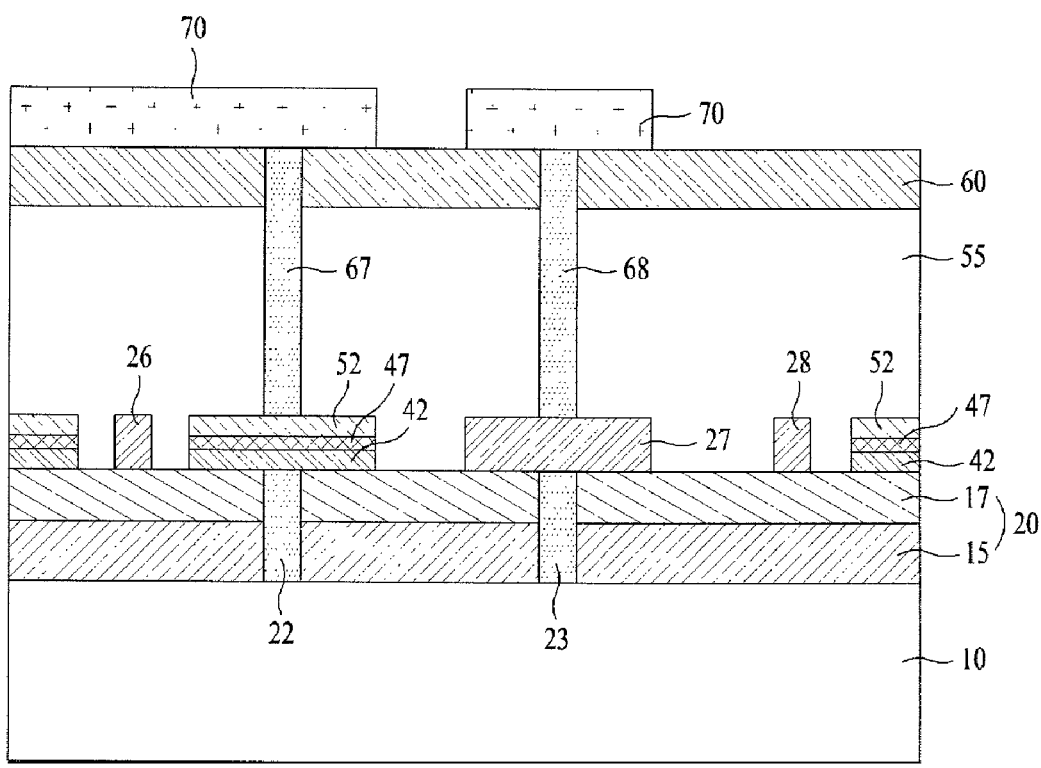

Example FIG. 7 is a sectional view illustrating a process for forming a contact between a MIM capacitor pattern and an upper metal pattern.

DESCRIPTION

Example FIGS. 1 to 7 illustrate a method for manufacturing a capacitor of a semiconductor device. Example FIG. 1 is a sectional view illustrating a process for depositing a metal over a semiconductor substrate to form a metal line. Referring to example FIG. 1, a first insulating layer 20, e.g., pre-metal dielectric (PMD) or inter-metal dielectric (IMD), may be formed over a semiconductor substrate 10.

For example, the formation of the first insulating layer 20 may be carried out by depositing a fluorine doped silicate (FSG) glass 15 or $SiH_4$ 17 over the semiconductor substrate 10 by chemical vapor deposition (CVD). In addition, the first insulating layer 20 may be formed by depositing the FSG 15 and $SiH_4$ 17 over the semiconductor substrate 10 by alternative methods.

A plurality of first photoresist patterns to form via holes may be formed over the first insulating layer 20 by a photolithographic process, and the first insulating layer 20 may be etched using the first photoresist patterns as etching masks. The first photoresist patterns may be removed and a conductive material may be embedded in the via holes to form a plurality of first contacts 22 and 23.

A metal layer 25 to form a metal line may be formed over the first insulating layer 20 provided with the first contacts 22 and 23. For example, an aluminum layer may be formed over the first insulating layer 20 provided with the first contacts 22 and 23 by chemical mechanical deposition (CVD).

Example FIG. 2 is a sectional view illustrating a process for forming photoresist patterns to form metal line patterns. Referring to example FIG. 2, a plurality of photoresist patterns 30 to form metal line patterns may be formed over the metal layer 25 by a photolithographic process. Specifically, a photoresist may be applied to the metal layer 25 and may then be patterned by exposing and developing processes to form a plurality of photoresist patterns 30 for the metal line patterns.

Example FIG. 3 is a sectional view illustrating a process for forming first metal line patterns 26, 27 and 28 using the photoresist patterns 30. Referring to example FIG. 3, the metal layer 25 is etched using the photoresist patterns 30 as etching masks to form first metal line patterns 26, 27 and 28.

For example, the first metal line patterns 26, 27 and 28 may be formed by etching the metal layer 25 using the photoresist patterns 30 as etching masks until the first insulating layer 20 is etched. At this time, a part of the first metal line patterns 26, 27 and 28, e.g., the pattern 27, may be connected to the first contacts 22 and 23.

Example FIG. 4 is a sectional view illustrating a process for reflowing photoresist patterns 30 to form a MIM capacitor pattern. Referring to example FIG. 4, the semiconductor substrate 10, in which the first metal line patterns 26, 27 and 28 are defined, is subjected to a thermal process to reflow the photoresist patterns formed over the first metal line patterns 26, 27 and 28.

Specifically, the thermal process causes a decrease in viscosity of the photoresist patterns 30 and thus an increase in flowablity thereof. As a result, a part of the photoresist patterns 30 flows over the sidewalls of the first metal line patterns 26, 27 and 28, while a part of the photoresist patterns 30 remain on the first metal line patterns 26, 27 and 28. Due to the thermal process, the shape of the photoresist pattern 30 may be varied. After the thermal process, the semiconductor substrate including the resulting structure may be cooled, to allow photoresist patterns having increased flowability to maintain the varied shape thereof.

Through the thermal and cooling processes, the photoresist patterns 30 present over the first metal line patterns 26, 27 and 28 may be varied into photoresists 31, 32, 33, 34, 35, 36, 37, 38 and 39 which are present both over the first metal line patterns 26, 27 and 28, and over opposite sidewalls thereof.

Hereinafter, the photoresist patterns 31 to 39 varied via the thermal and cooling processes are referred to as "reflowed photoresist patterns" 31 to 39.

The reflowed photoresist patterns 31 to 39 include a predetermined level of the surface of the first insulating layer 20 adjacent to opposite sidewalls of the first metal line patterns 26, 27 and 28, and wall-spacer photoresist patterns 31, 33, 34, 36, 37 and 39 to cover the opposite sidewalls, and photoresist patterns 32, 35 and 38 present over the metal line patterns. At this time, the photoresist patterns 32, 35 and 38 remaining over the metal line patterns may be thinner than the photoresist patterns 30.

The formation range of the wall-spacer photoresist patterns 31, 33, 34, 36, 37 and 39 may determine MIM capacitor patterns, as illustrated below. That is, MIM capacitor patterns may be arranged such that they correspond to the wall-spacer photoresist patterns 31, 33, 34, 36, 37, and 39.

Example FIG. 5 is a sectional view illustrating a process for forming a MIM layer over a semiconductor substrate. Referring to example FIG. 5, a capacitor lower metal layer 40, a capacitor insulating film 45, and a capacitor upper metal layer 50 may be sequentially formed over the semiconductor substrate 10 provided with the reflowed photoresist patterns 31 to 39. Hereinafter, the capacitor lower metal layer 40, the capacitor insulating film 45 and the capacitor upper metal layer 50 are referred to as "MIM layers" 40, 45 and 50.

For example, an aluminum layer 40 may be deposited over the semiconductor substrate 10 provided with the reflowed photoresist patterns 31 to 39 using a CVD method, a SiN layer 45 may be deposited over the aluminum layer 40 and at least one layer 50 of Ti or TiN may be deposited over the SiN layer 45.

Example FIG. 5 shows a profile in which the capacitor lower metal layer 40, the capacitor insulating film 45 and the capacitor upper metal layer 50 are laminated in this order over the semiconductor substrate 10 provided with the reflowed photoresist patterns 31 to 39. That is, an MIM layer A arranged over the reflowed photoresist patterns 31 to 39 is in the form of a bulge, and an MIM layer B arranged over the first insulating layer 20 not provided with the reflowed photoresist patterns may be flat.

Example FIG. 6 is a sectional view illustrating a process for forming a MIM capacitor pattern using a lift-off process. Referring to example FIG. 6, the reflowed photoresist patterns 31 to 39 arranged under the MIM layer are removed using the lift-off process. When the reflowed photoresist patterns 31 to 39 are removed through the lift-off process, the MIM layer A arranged over the reflowed photoresist patterns 31 to 39 is removed, but the MIM layer B arranged over the first insulating layer 20 not provided with the reflowed photoresist pattern remains.

Generally, the lift-off process refers to a process comprising forming photoresist patterns over the semiconductor substrate, depositing a thin film over the semiconductor substrate provided with the photoresist pattern, and patterning the thin film so that the thin film deposited over the photoresist pattern is removed and only the thin film deposited over the semiconductor substrate remains, in the step of dissolving the photoresist pattern in a photoresist solvent. At this time, a profile of the photoresist pattern may be in the form of a reverse taper, and a thin film pattern with a reversed form with respect to the photoresist pattern may be formed by removing the photoresist pattern by a lift-off process.

Specifically, the reflowed photoresist patterns 31 to 39 are removed by the photoresist solvent, allowing the MIM layer A present over the reflowed photoresist patterns 31 to 39 to be readily detached and removed. The MIM layers 40, 45 and 50 are formed to a small thickness to allow the photoresist solvent to be sufficiently permeated into the reflowed photoresist patterns 31 to 39. The reason for easy detachment and removal of the MIM layer A is that the MIM layer A is inelastic, and a surface thereof contacting the reflowed photoresist pattern is thin and soft, enabling easy tearing thereof. However, the MIM layer B over the first insulating layer 20 not provided with the reflowed photoresist patterns 31 to 39 is not removed and remains, to form MIM capacitor patterns 42, 47 and 52.

As shown in example FIG. 6, the MIM capacitor patterns 42, 47 and 52 may be arranged based on the reflowed photoresist patterns 31 to 39. That is, the MIM capacitor patterns 42, 47 and 52 may be formed over the first insulating layer 20 not provided with the first metal line patterns 26, 27 and 28.

The MIM capacitor patterns 42, 47 and 52 may be patterned using the patterned photoresist patterns 30 for formation of the first metal line patterns 26, 27 and 28. That is, without manufacturing an additional mask to form the MIM capacitor patterns 42, 47 and 52, photoresist patterns 30 patterned to form the first metal line patterns 26, 27 and 28 are subjected to a reflow process, the reflowed photoresist patterns 31 to 39 are removed by a lift-off process, to form the MIM capacitor patterns 42, 47 and 52. In addition, since the MIM capacitor patterns 42, 47 and 52 are formed in a region wherein the metal line patterns are absent, optimized integration of a semiconductor device can be realized.

Example FIG. 7 is a sectional view illustrating a process for forming a contact between a MIM capacitor pattern and an upper metal pattern. Referring to example FIG. 7, the second insulating layers 55 and 60 are formed over the semiconductor substrate provided with the MIM capacitor patterns 42, 47 and 52. For example, the second insulating layers 55 and 60 may be formed by laminating at least one of a fluorine doped silicate (FSG) glass 55 and $SiH_4$ 60.

Photoresist patterns to form via holes are formed over the second insulating layers 55 and 60 through a photolithographic process, the second insulating layers 55 and 60 are etched using the photoresist patterns as etching masks to form via holes in the second insulating layers 55 and 60. In addition, a conductive material may be embedded into the via holes to form second contacts 67 and 68. The second contacts 67 and 68 are connected to the first metal line patterns 26, 27 and 28, and the MIM capacitor patterns 42, 47 and 52.

Second metal line patterns 70 are formed over the second insulating layers 55 and 60 provided with the second contacts 67 and 68. The second metal line patterns 70 may be connected through the second contacts 67 and 68 to the first metal line patterns 26, 27 and 28, or the MIM capacitor patterns 42, 47 and 52.

As apparent from the fore-going, in accordance with the method for manufacturing a semiconductor device according to embodiments, photoresist patterns to form metal line patterns may be subjected to a reflow process to form reflowed photoresist patterns, and the reflowed photoresist patterns may be removed by a lift-off process, thereby forming a MIM capacitor pattern without manufacturing an additional mask.

In addition, the method has an advantage of integration of semiconductor devices, in that the MIM capacitor patterns are formed in a region where metal line patterns are absent.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    sequentially forming an insulating layer and a metal layer over a semiconductor substrate;
    forming a photoresist pattern over the metal layer and etching the metal layer using the photoresist pattern as an etching mask to form a metal line pattern;
    subjecting the photoresist pattern to a reflow process to form a reflowed photoresist pattern surrounding the metal line pattern;
    forming a metal-insulator-metal layer over the semiconductor substrate provided with the reflowed photoresist pattern; and
    removing the metal-insulator-metal layer arranged over the photoresist pattern and the photoresist pattern.

2. The method of claim 1, wherein the sequential formation of the insulating layer and the metal layer comprises depositing at least one of a fluorine doped silicate glass and $SiH_4$ over the semiconductor substrate to form the insulating layer.

3. The method of claim 1, wherein the sequential formation of the insulating layer and the metal layer comprises depositing an aluminum layer over the insulating layer to form the metal layer.

4. The method of claim 1, wherein the formation of the reflowed photoresist pattern is carried out by reflowing the photoresist pattern using a thermal process.

5. The method of claim 4, wherein the reflowed photoresist pattern covers the metal line pattern and opposite side walls thereof.

6. The method of claim 5, wherein the reflowed photoresist pattern includes wall-spacers to cover the opposite sidewalls of the metal line pattern, and a predetermined range of the surface of the insulating layer adjacent to opposite sidewalls of the metal line pattern.

7. The method of claim 1, wherein the formation of the reflowed photoresist pattern includes cooling the photoresist pattern after the thermal process.

8. The method of claim 1, wherein the formation of the metal-insulator-metal layer comprises depositing an aluminum film over a semiconductor substrate provided with the reflowed photoresist pattern.

9. The method of claim 8, wherein the formation of the metal-insulator-metal layer comprises depositing a SiN film over the deposited aluminum film.

10. The method of claim 9, wherein the formation of the metal-insulator-metal layer comprises depositing at least one of Ti and TiN over the deposited SiN film.

11. The method of claim 1, wherein the formation of the metal-insulator-metal layer is carried out by sequentially depositing an aluminum film, silicon nitride and tungsten over the semiconductor substrate provided with the reflowed photoresist pattern.

12. The method of claim 1, wherein the removal of the reflowed photoresist pattern and the metal-insulator-metal layer arranged over the reflowed photoresist pattern is carried out by lifting off the reflowed photoresist pattern.

13. The method of claim 12, wherein the removal of the reflowed photoresist pattern and the metal-insulator-metal layer arranged on the reflowed photoresist pattern forms a metal-insulator-metal capacitor pattern in which the metal-insulator-metal layer present over the insulating layer not provided with the reflowed photoresist pattern remains.

\* \* \* \* \*